United States Patent
Choi et al.

(10) Patent No.: US 8,173,949 B2
(45) Date of Patent: May 8, 2012

(54) IMAGE SENSING APPARATUS WITH ARTIFICIAL OMMATIDIA AND MANUFACTURING METHOD FOR ARTIFICIAL OMMATIDIA UNIT

(75) Inventors: Seung-tae Choi, Osan-si (KR); Min-seog Choi, Seoul (KR); Jeong-yub Lee, Seoul (KR); Woon-bae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/138,530

(22) Filed: Jun. 13, 2008

(65) Prior Publication Data

US 2009/0127439 A1    May 21, 2009

(30) Foreign Application Priority Data

Nov. 19, 2007  (KR) .................. 10-2007-0118048

(51) Int. Cl.
*G02B 6/06*        (2006.01)
(52) U.S. Cl. ................ 250/227.2; 250/216; 250/227.28; 257/432; 359/619
(58) Field of Classification Search ............... 250/208.1, 250/216, 227.11, 227.2, 227.28; 257/431, 257/432, 434, 436; 359/34, 619, 648; 356/73.1, 356/239.2
See application file for complete search history.

(56) References Cited

U.S. PATENT DOCUMENTS

| | | | |
|---|---|---|---|
| 3,819,940 A | 6/1974 | Laws | |
| 4,818,860 A | 4/1989 | Hasegawa | |
| 5,125,064 A * | 6/1992 | Naselli et al. ................. | 385/116 |
| 5,311,611 A | 5/1994 | Migliaccio | |
| 5,517,019 A | 5/1996 | Lopez | |
| 6,115,168 A * | 9/2000 | Zhao et al. .................... | 359/247 |
| 2002/0096629 A1 | 7/2002 | Korein | |
| 2005/0109918 A1* | 5/2005 | Nikzad et al. ............. | 250/208.1 |
| 2008/0277566 A1* | 11/2008 | Utagawa ................... | 250/208.1 |

FOREIGN PATENT DOCUMENTS

| | | |
|---|---|---|
| DE | 2929971 A1 | 2/1981 |
| EP | 0384377 A2 | 8/1990 |
| GB | 1402588 | 8/1975 |
| JP | 10-107975 A | 4/1998 |
| WO | WO 2006129677 A1 * | 12/2006 |
| WO | 2007123586 A2 | 11/2007 |

OTHER PUBLICATIONS

Kim et al., Artifical Ommatidia by Self-Aligned Microlenses and Waveguides, Jan. 1, 2005, Optics Letters, vol. 30, No. 1, pp. 5-7.*
European Search Report, dated Aug. 11, 2010, issued in application No. 08164530.1.

* cited by examiner

*Primary Examiner* — Francis M Legasse, Jr.
(74) *Attorney, Agent, or Firm* — Sughrue Mion, PLLC

(57) ABSTRACT

An image sensing apparatus with artificial ommatidia includes an imaging optical lens group forming a concave focal surface, an artificial ommatidia unit having a curved top surface corresponding to the concave focal surface and a flat bottom surface, and an image sensor disposed under the artificial ommatidia unit. The artificial ommatidia unit is disposed under the imaging optical lens group so that the curved top surface is coincided with the concave focal surface of the imaging optical lens group. The artificial ommatidia unit having a plurality of artificial ommatidia collects light emitting from the imaging optical lens group, and guides the light to the bottom surface thereof.

12 Claims, 5 Drawing Sheets

IMAGE SENSING APPARATUS WITH ARTIFICIAL OMMATIDIA AND MANUFACTURING METHOD FOR ARTIFICIAL OMMATIDIA UNIT

CROSS-REFERENCE TO RELATED APPLICATIONS

This application claims the benefit from Korean Patent Application No. 2007-118048 filed Nov. 19, 2007 in the Korean Intellectual Property Office, the disclosure of which is incorporated herein by reference in its entirety.

BACKGROUND OF THE INVENTION

1. Field of the Invention

Apparatuses and methods consistent with the present inventive concept relates to image sensing. More particularly, the present general inventive concept relates to an image sensing apparatus with artificial ommatidia and a manufacturing method for artificial ommatidia used to the image sensing apparatus.

2. Description of the Related Art

Generally, an image sensing apparatus used in an image recording apparatus such as a digital camera has an imaging optical system allow light entering from outside to focus on an image sensor. The imaging optical system is basically provided with a curved focal plane. However, the image sensor used to the image sensing apparatus is generally provided with a flat sensing surface. Therefore, when light enters the image sensor through the imaging optical system, the amount of the light at a circumference of the image sensor is less than the amount of the light at a center of the image sensor, and a distortion occurs so that image quality would be deteriorated.

For solving the problems, a complex imaging optical system configured of a plurality of aspherical lenses may be used so that images are focused on the flat image sensor. However, even when the complex imaging optical system is used, the circumference of the image sensor still receives a small amount of light, so a vignetting phenomenon occurs. To prevent this problem, pixels forming the circumference of the image sensor may be moved. However, there is a problem that this method is required to increase an interval between pluralities of pixels constituting the image sensor.

SUMMARY OF THE INVENTION

The present general inventive concept provides an image sensing apparatus with artificial ommatidia increasing the amount of light to enter a circumference of an image sensor and a method for manufacturing the artificial ommatidia used to the image sensing apparatus.

Additional aspects and utilities of the present general inventive concept will be set forth in part in the description which follows and, in part, will be obvious from the description, or may be learned by practice of the general inventive concept.

The foregoing and/or other aspect and utilities of the present general inventive concept can substantially be achieved by providing an image sensing apparatus with artificial ommatidia, which includes an imaging optical lens group forming a concave focal plane; an artificial ommatidia unit having a curved top surface corresponding to the concave focal plane and a flat bottom surface, the artificial ommatidia unit disposed under the imaging optical lens group so that the curved top surface is coincided with the concave focal plane of the imaging optical lens group, and the artificial ommatidia unit having a plurality of artificial ommatidia to collect light emitting from the imaging optical lens group and to guide the light to the bottom surface thereof; and an image sensor disposed under the artificial ommatidia unit.

At this time, each of the plurality of artificial ommatidia of the artificial ommatidia unit may correspond to at least one pixel among a plurality of pixels constituting the image sensor.

Each of the plurality of artificial ommatidia of the artificial ommatidia unit includes a micro lens disposed on the top surface of the artificial ommatidia unit; and a waveguide disposed under the micro lens to transmit the light entering the micro lens.

The waveguide may be formed perpendicular to the bottom surface of the artificial ommatidia unit.

The artificial ommatidia unit may be formed of a photosensitive polymer resin.

The photosensitive polymer resin may comprise a SU-8 resin.

The waveguide may be a self-written waveguide formed by emission of ultraviolet rays.

The foregoing and/or other aspects and utilities of the present general inventive concept can also be achieved by providing a method for manufacturing an artificial ommatidia unit, which includes: forming an artificial ommatidia unit mold; forming an artificial ommatidia unit body with a micro lens array using the artificial ommatidia unit mold; and radiating ultraviolet rays onto the artificial ommatidia unit body to form a plurality of waveguides corresponding to the micro lens array.

The forming of the artificial ommatidia unit mold may include forming the micro lens array on a substrate using a photoresist; forming a mold layer on the micro lens array; and bending the mold layer to convex a surface of the mold layer on which the micro lens array is formed.

The bending of the mold layer may include forming a mold layer bending fixture on the mold layer; separating the substrate from the mold layer; and applying a pressure higher than an outside pressure to an inside of the mold layer bending fixture so that the mold layer is bent to convex the surface of the mold layer on which the micro lens array is formed.

The mold layer may be bent so that the surface thereof on which the micro lens array is formed has a curvature coincided with the concave focal plane of the imaging optical lens group.

The mold layer and the mold layer bending fixture may be formed of a polydimethylsiloxane (PDMS).

The forming of the artificial ommatidia unit body may include; preparing a glass plate; forming a photosensitive polymer resin layer on the glass plate; pressing a top surface of the photosensitive polymer resin layer using the artificial ommatidia unit mold; and separating the artificial ommatidia unit mold from the photosensitive polymer resin layer.

The forming of the plurality of waveguides may include; radiating the ultraviolet rays through a lens; causing the ultraviolet rays to harden portions of the photosensitive polymer resin layer of the artificial ommatidia unit body to form cores; and heating the artificial ommatidia unit body so that portions of the photosensitive polymer resin layer not hardened by the ultraviolet rays are hardened to form matrixes.

BRIEF DESCRIPTION OF THE DRAWINGS

These and/or other aspects and utilities of the present general inventive concept will become apparent and more readily appreciated from the following description of the exemplary embodiments, taken in conjunction with the accompanying drawings of which.

DETAILED DESCRIPTION OF THE EXEMPLARY EMBODIMENTS

Figure 1:
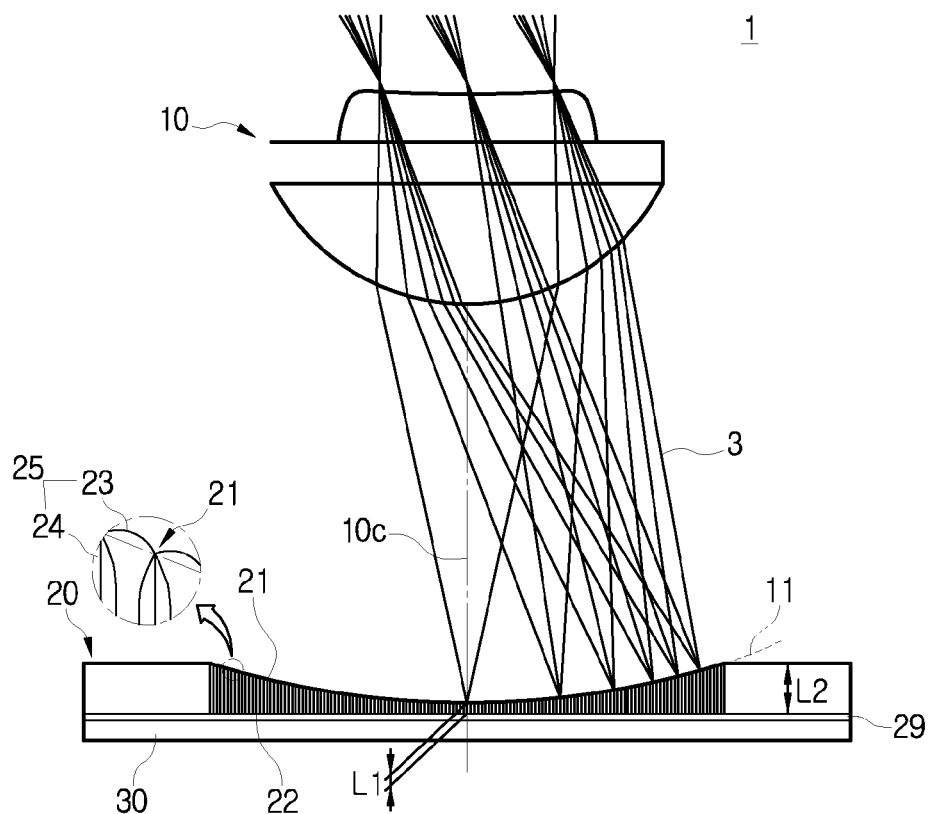
FIG. 1 is a sectional view schematically illustrating an image sensing apparatus with artificial ommatidia according to an exemplary embodiment of the present general inventive concept.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

The matters defined in the description, such as a detailed construction and elements thereof, are provided to assist in a comprehensive understanding of the present general inventive concept. Thus, it is apparent that the present inventive concept may be carried out without those defined matters. Also, well-known functions or constructions are omitted to provide a clear and concise description of exemplary embodiments herein.

FIG. 1 is a sectional view schematically illustrating an image sensing apparatus 1 with artificial ommatidia according to an exemplary embodiment of the present general inventive concept. The present invention is not limited to artificial ommatidia but includes optical units including the features mentioned below.

Referring to FIG. 1, the image sensing apparatus 1 with artificial ommatidia according to an exemplary embodiment of the present general inventive concept includes an imaging optical lens group 10, an artificial ommatidia unit 20, and an image sensor 30. In an exemplary embodiment, there is an optical unit 20.

The imaging optical lens group 10 collects light from outside to form an image, and forms a concave focal surface 11 at a predetermined distance therefrom. The focal surface 11 formed by the imaging optical lens group 10 is substantially a concave curved surface substantially similar to a spherical surface. The imaging optical lens group 10 may include at least one lens.

The artificial ommatidia unit 20 gathers and guides the light 3 focusing on the concave focal surface 11 of the imaging optical lens group 10 to the image sensor 30. The artificial ommatidia unit 20 includes a top surface 21 corresponding to the concave focal surface 11 of the imaging optical lens group 10 and a bottom surface 22 formed of a flat plane. In an exemplary embodiment, the top surface 21 is substantially parallel to the concave focal surface 11. A glass plate 29 may be disposed beneath the bottom surface 22 of the artificial ommatidia unit 20. A plurality of micro lenses 23 collecting the light 3 emitting from the imaging optical lens group 10 is formed on the top surface 21 of the artificial ommatidia unit 20. That is, the plurality of micro lenses 23 is arranged on the concave focal surface 11 of the imaging optical lens group 10.

Figure 2:
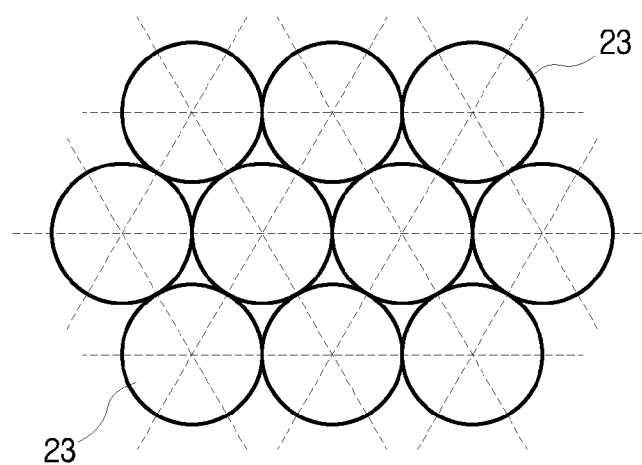
FIG. 2 is a partial plan view illustrating an artificial ommatidia unit of the image sensing apparatus with artificial ommatidia of FIG. 1.

Each of the plurality of micro lenses 23 is formed in a spherical convex lens or an aspherical convex lens. The plurality of micro lenses 23 is arranged in a regular interval to form a micro lens array. The plurality of micro lenses 23 may be arranged, as illustrated in FIG. 2, in a substantially hexagonal shape on the concave top surface 21 of the artificial ommatidia unit 20. Alternatively, although not illustrated, the plurality of micro lenses 23 may be arranged in a substantially tetragonal shape. Furthermore, as long as the plurality of micro lenses 23 can effectively collect the light 3 emitting from the imaging optical lens group 10, they may be arranged in various shapes.

Also, each of the plurality of micro lenses 23 may respectively be arranged to correspond to each of the plurality of pixels of the image sensor 30. Alternatively, each of the plurality of micro lenses 23 may be arranged to correspond to a plurality of pixels of the image sensor 30. That is, one micro lens 23 may be arranged to correspond to two or more pixels of the image sensor 30. For example, one micro lens 23 is arranged to correspond to three pixels of the image sensor 30, that is, pixels for red, green, and blue.

Figure 3:
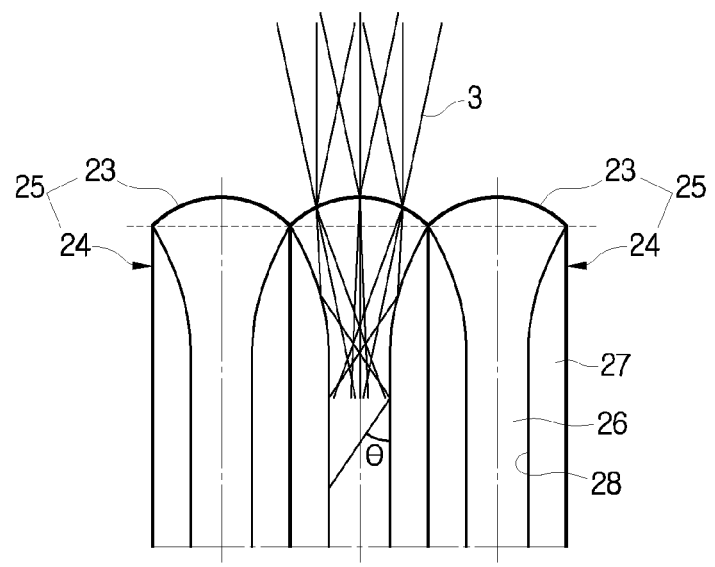
FIG. 3 is a partial sectional view illustrating an artificial ommatidia unit of the image sensing apparatus with artificial ommatidia of FIG. 1.

A plurality of waveguides 24 is formed beneath the plurality of micro lenses 23 as illustrated in FIG. 3 so that each of the plurality of waveguides 24 corresponds to each of the plurality of micro lenses 23. The waveguide 24 allows the light 3 collected by the micro lens 23 to be guided to the bottom surface 22 of the artificial ommatidia unit 20 and to enter the image sensor 30. Length L1 of the waveguide 24 near an optical axis 10c of the imaging optical lens group 10 is short. The waveguides 24 disposed further away from the optical axis 10c and closer to the circumference, are longer. Therefore, the outermost waveguides 24 have the longest length L2. Also, the plurality of waveguides 24 may be formed perpendicularly with respect to the bottom surface 22 of the artificial ommatidia unit 20 as illustrated in FIG. 1.

A unit optical system composed of one micro lens 23 and one waveguide 24 connected with each other forms one artificial ommatidium 25. Therefore, the artificial ommatidia unit 20 has a plurality of artificial ommatidia 25 corresponding to the number of the plurality of micro lenses 23.

The waveguide 24 includes a core 26 and a matrix 27 as illustrated in FIG. 3. The core 26 forms a pathway through which the light 3 collected by the micro lens 23 passes. If total reflection takes place at a boundary surface 28 between the core 26 and the matrix 27, the light 3 can be transmitted through the core 26 of the waveguide 24. For this, a refractive index of the core 26 is required to be larger than a refractive index of the matrix 27, and an incidence angle of the light 3, which is refracted by the micro lens 23 and enters the boundary surface 28 between the core 26 and the matrix 27 of the waveguide 24, is required to be larger than a critical angle of the boundary surface 28 between the core 26 and the matrix 27. Therefore, the waveguide 24 needs to be manufactured of a material to satisfy the condition.

For example, when the waveguide 24 is formed of SU-8 resin, which is a sort of photosensitive polymer resin, the refractive index $n_1$ of the core 26 is 1.584, and the refractive index $n_2$ of the matrix 27 is 1.614. At this time, the critical angle of the boundary surface 28 between the core 26 and the matrix 27 of the waveguide 24 calculated by Snell's law is approximately 11 degrees. The light 3 enters the micro lens 23 with an incidence angle of approximately 15 degrees, and then, is refracted at an angle less than 15 degrees by the micro lens 23 so that the SU-8 resin can sufficiently function as the waveguide 24.

The image sensor 30 is disposed beneath the artificial ommatidia unit 20, and perceives the light 3 entering through the plurality of artificial ommatidia 25 configuring the artificial ommatidia unit 20. The image sensor 30 has a flat sensing surface, so the image sensor 30 is disposed parallel to the bottom surface 22 of the artificial ommatidia unit 20. Various image sensors such as CMOS image sensor (CIS), etc. can be used as the image sensor 30. Therefore, a detailed explanation about the image sensor 30 will be omitted.

Hereinafter, operation of the image sensing apparatus 1 with artificial ommatidia according to an exemplary embodiment of the present general inventive concept will be explained with reference to FIGS. 1 and 3.

As illustrated in FIG. 1, the light 3 passes through the imaging optical lens group 10, and focuses on the concave focal surface 11 of the imaging optical lens group 10. At this time, the artificial ommatidia unit 20 locates at the focal surface 11 of imaging optical lens group 10 so that the light 3 having passed through the imaging optical lens group 10 is guided to the image sensor 30 by the plurality of artificial ommatidia 25 of the artificial ommatidia unit 20.

Hereinafter, a process through which the artificial ommatidia unit 20 guides the light 3 to the image sensor 30 will be explained in detail.

The light 3 having passed through the imaging optical lens group 10, as illustrated in FIG. 1, enters the plurality of micro lenses 23 formed on the top surface 21 of the artificial ommatidia unit 20. The light 3 entering the micro lens 23 is, as illustrated in FIG. 3, refracted by the micro lens 23, so enters the waveguide 24. The light 3 entering the waveguide 24 moves to the boundary surface 28 between the core 26 and the matrix 27 of the waveguide 24. At this time, the light 3 entering the boundary surface 28 between the core 26 and the matrix 27 has an incidence angle larger than the critical angle of the boundary surface 28 between the core 26 and the matrix 27 so that the light 3 is totally reflected. As a result, the light 3 having entered the waveguide 24 via the micro lens 23 moves downward along the core 26 of the waveguide 24 to be guided to the image sensor 30.

At this time, because the plurality of micro lenses 23 formed on the artificial ommatidia unit 20 is arranged on the concave focal surface 11 of the imaging optical lens group 10, the micro lenses 23 arranged at the circumferential portion of the artificial ommatidia unit 20 also can effectively collect the light 3 emitting from the imaging optical lens group 10.

Furthermore, in the conventional image sensing apparatus, when the imaging optical lens group with the concave focal surface is used to guide light to the image sensor with the flat sensing surface, a chief ray angle (hereinafter, refer to as CRA) of the light entering the image sensor is approximately 25 degrees. However, the image sensing apparatus 1 with artificial ommatidia according to an exemplary embodiment of the present general inventive concept has the plurality of micro lenses 23 arranged on the concave focal surface 11 of the imaging optical lens group 10 so that CRA is maximally 3.8 degrees. As a result, the amount of light the circumference of the image sensor 30 disposed away from the optical axis 10c of the imaging optical lens group 10 receives may not be insufficient. Therefore, when using the image sensing apparatus 1 with artificial ommatidia according to an exemplary embodiment of the present general inventive concept, a vignetting phenomenon does not occur.

Also, the image sensing apparatus 1 with artificial ommatidia according to an exemplary embodiment of the present general inventive concept uses the artificial ommatidia unit 20 as described above to solve the difference of the shape between the concave focal surface 11 of the imaging optical lens group 10 and the flat sensing surface of the image sensor 30. Therefore, image quality deterioration such as a distortion does not occur.

As a result, the image sensing apparatus 1 with artificial ommatidia according to an exemplary embodiment of the present general inventive concept is not required to use many of lenses and/or lenses with a complex profile to solve the problems as described above. Therefore, the structure thereof is simple, and manufacturing is easy. For example, the conventional image sensing apparatus used for a camera cell phone is required to have three or more lenses. However, when the image sensing apparatus 1 with artificial ommatidia according to an exemplary embodiment of the present general inventive concept is used for the camera cell phone, only one lens or two lenses are required.

Figure 4:
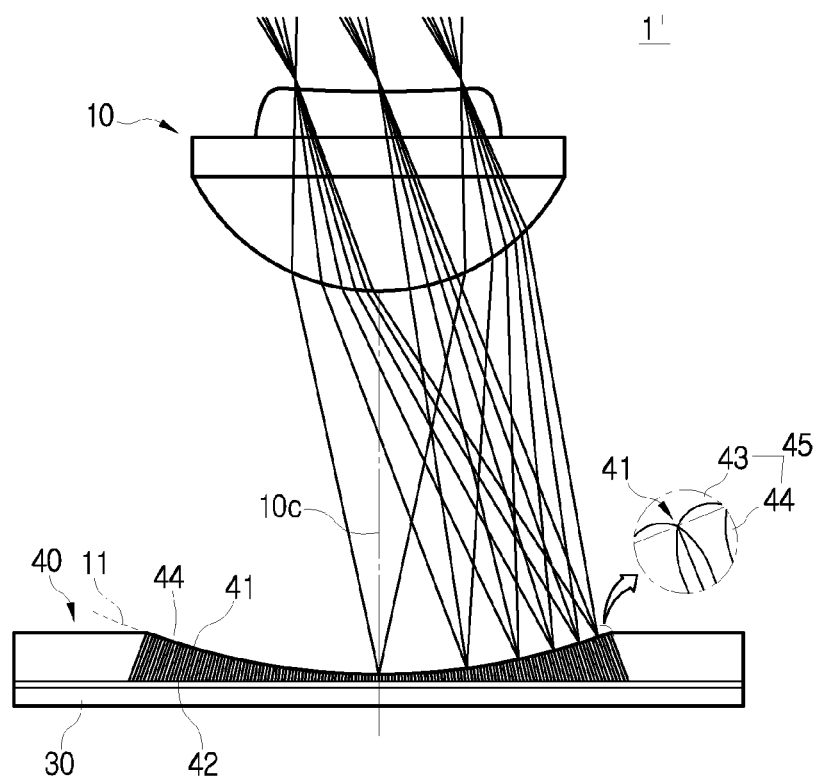
FIG. 4 is a sectional view schematically illustrating an image sensing apparatus with artificial ommatidia according to another exemplary embodiment of the present general inventive concept.

FIG. 4 is a sectional view schematically illustrating an image sensing apparatus 1' with artificial ommatidia according to another exemplary embodiment of the present general inventive concept.

Referring to FIG. 4, the image sensing apparatus 1' with artificial ommatidia according to another exemplary embodiment of the present general inventive concept includes the imaging optical lens group 10, an artificial ommatidia unit 40, and the image sensor 30.

The artificial ommatidia unit 40 includes a plurality of micro lenses 43 and a plurality of waveguides 44 in a one to one correspondence. One micro lens 43 and one waveguide 44 form one artificial ommatidium 45. The plurality of micro lenses 43 is arranged on a top surface 41 of the artificial ommatidia unit 40 forming the focal surface 11 of the imaging optical lens group 10. A portion of the plurality of waveguides 44 is, as illustrated in FIG. 4, formed to be inclined with respect to the optical axis 10c of the imaging optical lens group 10. That is, the portion of the plurality of waveguides 44 is formed to be inclined with respect to a bottom surface 42 of the artificial ommatidia unit 40. At this time, another portion of the waveguide 44 which is located at the optical axis 10c of the imaging optical lens group 10, is formed parallel to the optical axis 10c, that is, perpendicular to the bottom surface 42 of the artificial ommatidia unit 40. For example, the plurality of waveguides 44 may be formed to be arranged radially from a point at the optical axis 10c of the imaging optical lens group 10. Except that the waveguides 44 are formed to be inclined with respect to the optical axis 10c of the imaging optical lens group 10, the artificial ommatidia unit 40 is similar to the artificial ommatidia unit 20 of the above-described image sensing apparatus 1, and therefore, a detailed explanation thereof will not be repeated.

Also, structures and operations of the imaging optical lens group 10 and the image sensor 30 of the image sensing apparatus 1' are substantially the same as those of the image sensing apparatus 1 as described above, and therefore, detailed explanations thereof will not be repeated.

Hereinafter, a method for manufacturing the artificial ommatidia unit 20 used to the image sensing apparatus 1 with artificial ommatidia according to an exemplary embodiment of the present general inventive concept will be explained in detail with reference to FIGS. 5A to 5H.

Figure 5A:
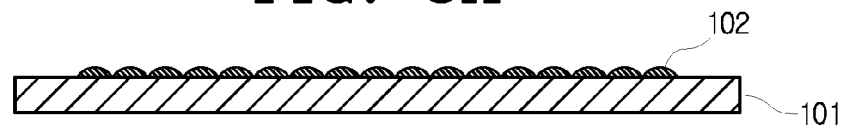
FIGS. 5A to 5H are process views illustrating a process for manufacturing an artificial ommatidia unit according to an exemplary embodiment of the present general inventive concept.
Figure 5B:
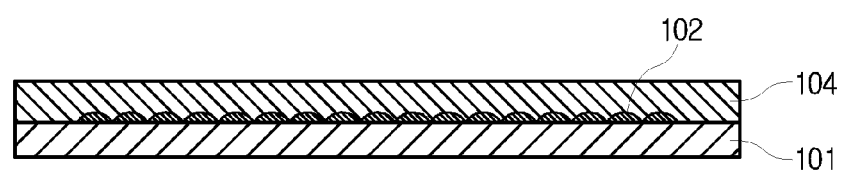
Figure 5C:
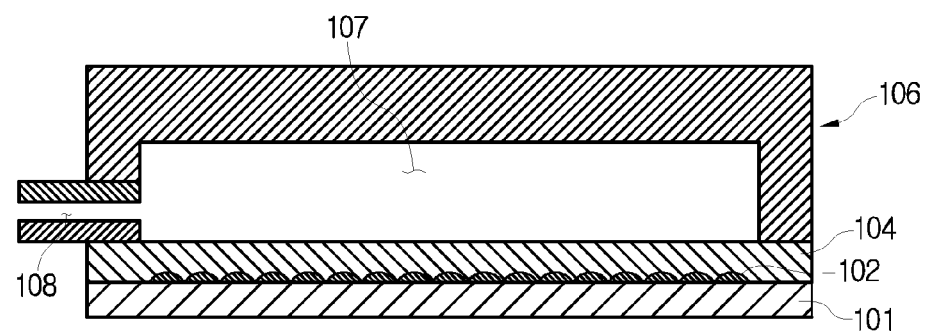
Figure 5D:
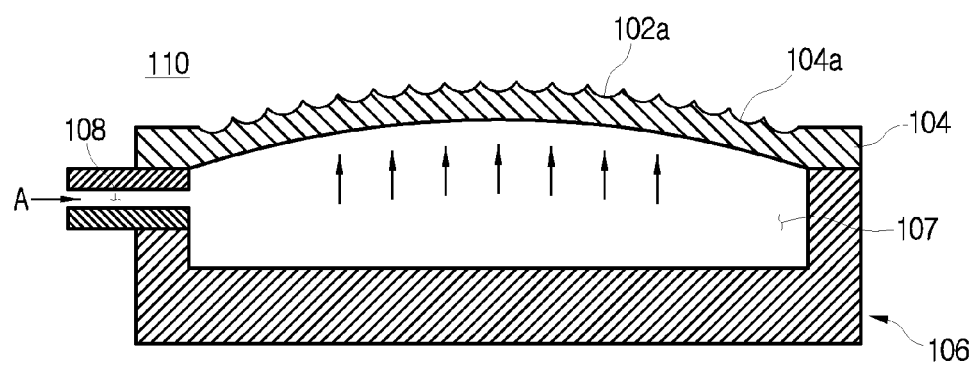
Figure 5E:
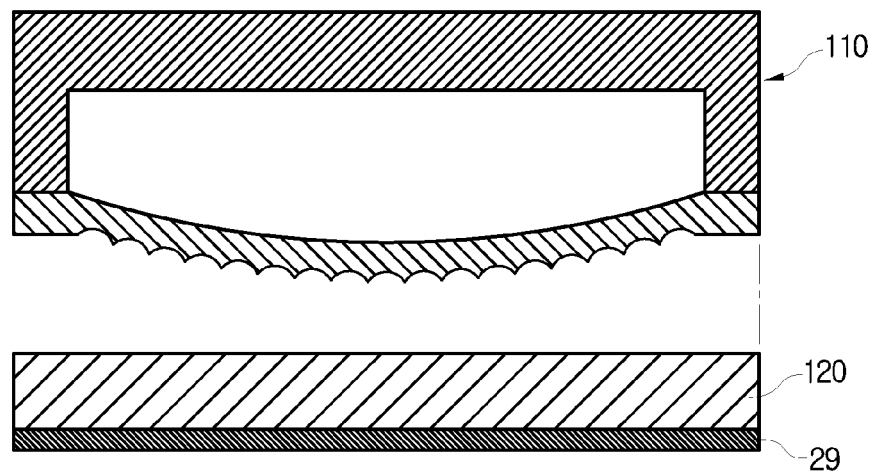

The method for manufacturing the artificial ommatidia unit 20 according to an exemplary embodiment of the present general inventive concept may include a process for manufacturing an artificial ommatidia unit mold 110 (see FIG. 5D)

used as a tool forming the top surface 21 of the artificial ommatidia unit 20, and a process for manufacturing the artificial ommatidia unit 20 using the artificial ommatidia unit mold 110.

First, the process for manufacturing the artificial ommatidia unit mold 110 will be explained with reference to FIGS. 5A to 5D.

As illustrated in FIG. 5A, a model of a micro lens array 102 is formed on a substrate 101 such as a silicon wafer, using a photoresist.

Subsequently, as illustrated in FIG. 5B, a polydimethylsiloxane (PDMS) is deposited on the model of the micro lens array 102 to form a mold layer 104.

A mold layer fixture 106 is formed on the mold layer 104. The mold layer fixture 106 may be formed directly on the mold layer 104 using the polydimethylsiloxane. Alternatively, the mold layer fixture 106 may be formed in a separate process. That is, the mold layer fixture 106 provided with a cavity portion 107 and an air inlet 108 fluidly communicating with the cavity portion 107 as illustrated in FIG. 5C may be formed using a separate general semiconductor fabrication process. The mold layer fixture 106 may be manufactured of polydimethylsiloxane. After that, the mold layer fixture 106 is fixed to the mold layer 104. So the cavity portion 107 is formed between the mold layer 104 and the mold layer fixture 106.

Next, the substrate 101 is separated from the mold layer 104. Then, an intaglioed micro lens array 102a for forming the plurality of micro lenses is formed on an outer surface 104a of the mold layer 104. Air A is blown into the cavity portion 107 via the air inlet 108 of the mold layer fixture 106 so that a pressure in the cavity portion 107 under the mold layer 104 is higher than an outside pressure of the mold layer 104. So the mold layer 104 is pushed so that the outer surface 104a of the mold layer 104 becomes a convex curved surface, thereby completing the artificial ommatidia unit mold 110 for forming the top surface 21 of the artificial ommatidia unit 20. At this time, air pressure is regulated so that the outer surface 104a of the mold layer 104 coincides with the concave focal surface 11 (see FIG. 1) of the imaging optical lens group 10.

Next, the method for forming an artificial ommatidia unit body in the separate process will be explained.

First, the glass plate 29 is prepared. Then, a photosensitive polymer resin layer 120 is formed on the glass plate 29 by a height corresponding to the artificial ommatidia unit 20 (see FIG. 5E).

Figure 5F:
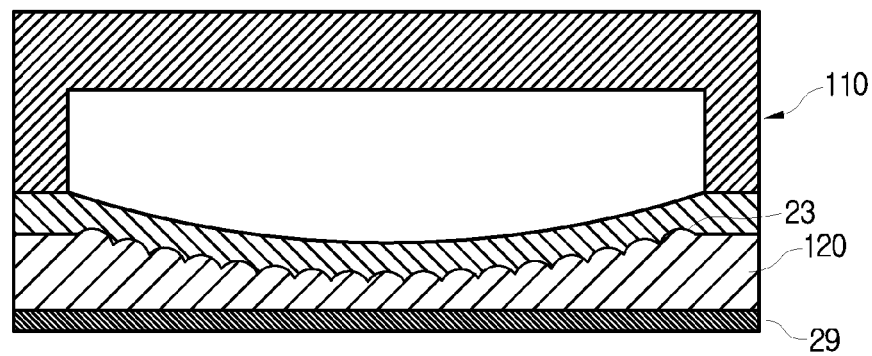
Figure 5G:
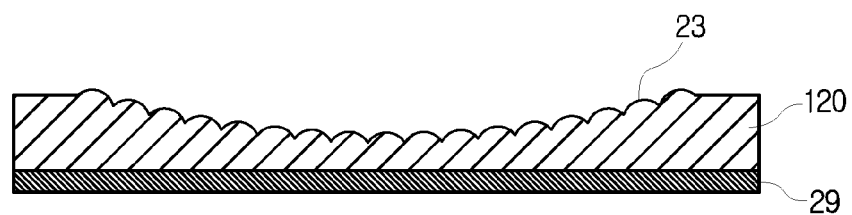

As illustrated in FIG. 5F, a top surface of the photosensitive polymer resin layer 120 is pressed by the artificial ommatidia unit mold 110 manufactured in the previous process. After that, the artificial ommatidia unit mold 110 is separated from the photosensitive polymer resin layer 120 so that the artificial ommatidia unit body with the plurality of micro lenses 23 formed on the top surface of the photosensitive polymer resin layer 120 is completed as illustrated in FIG. 5G.

Figure 5H:
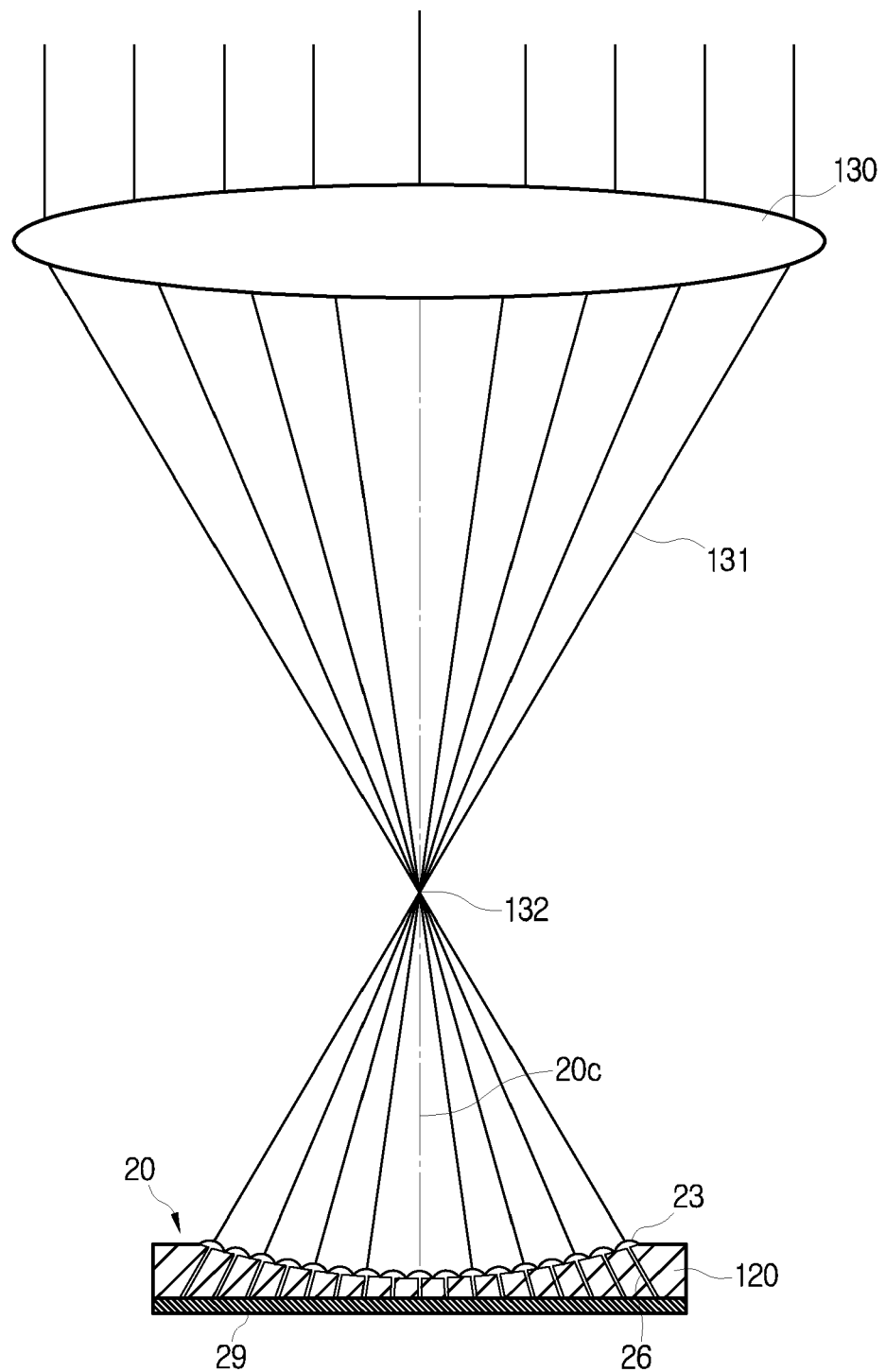

Next, as illustrated in FIG. 5H, ultraviolet rays 131 are radiated onto the artificial ommatidia unit body so that the core 26 of each of the plurality of waveguides is formed. At this time, a phenomenon is used that when the ultraviolet rays 131 are radiated onto the photosensitive polymer resin layer 120 constituting the artificial ommatidia unit body, only portions of the photosensitive polymer resin layer 120 through which the ultraviolet rays 131 pass are hardened.

Therefore, a lens 130, etc. may be used so that the ultraviolet rays 131 emitting from an ultraviolet ray generator (not illustrated) enter each of the plurality of micro lenses 23 formed on the top surface of the artificial ommatidia unit body. In FIG. 5H, a condenser lens 130 is used so that the ultraviolet rays 131 emitting from the ultraviolet ray generator converge into a focus 132 at a center axis 20c of the artificial ommatidia unit 20, and then, enter each of the plurality of micro lenses 23 of the artificial ommatidia unit 20. So portions of the photosensitive polymer resin layer 120 through which the ultraviolet rays 131 passed under the micro lenses 23 are hardened. Each of the portions of the photosensitive polymer resin layer 120 hardened by the ultraviolet rays 131 forms the core 26 of the waveguide 24 (see FIG. 3). In an alternative exemplary embodiment parallel ultraviolet rays are directly received by the plurality of micro lenses 23 to form parallel cores 26 of the waveguide 24 (see FIG. 1).

After that, the artificial ommatidia unit body is heated. Then, the other portions of the photosensitive polymer resin layer 120 of the artificial ommatidia unit body not hardened by the ultraviolet rays 131 are hardened by the heat, so that the artificial ommatidia unit 20 is completed. The other portion of the photosensitive polymer resin layer 120 hardened by the heat forms the matrix 27 of the waveguide 24 (see FIG. 3).

The waveguide 24 having the core 26 formed by the emission of the ultraviolet rays 131 is referred to as a self-written waveguide.

When the total reflection occurs at the boundary surface 28 between the core 26 and the matrix 27, the self-written waveguide can downwardly transmit the light 3 entering the micro lens 23. Therefore, the photosensitive polymer resin forming the artificial ommatidia unit 20 is required such that a refractive index of the core 26 hardened by the ultraviolet rays 131 is larger than a refractive index of the matrix 27 hardened by the heat. When the artificial ommatidia unit 20 is manufactured using SU-8 resin as the photosensitive polymer resin, the critical angle of the boundary surface 28 between the core 26 and the matrix 27 of the waveguide 24 is approximately 11 degrees. Therefore, the waveguide 24 formed in the self-written method using SU-8 resin can transmit the light entering from the micro lens 23.

In the above explanation, a case of forming one artificial ommatidia unit 20 is explained for convenience of explanation. However, it goes without saying that the plurality of artificial ommatidia units 20 can be simultaneously manufactured using the same method as described above.

As described above, the method of manufacturing the artificial ommatidia unit according to an exemplary embodiment of the present general inventive concept can use the general semiconductor fabrication process. Therefore, manufacturing the artificial ommatidia unit is easy.

Although a few exemplary embodiments of the present general inventive concept have been illustrated and described, it will be appreciated by those skilled in the art that changes may be made in these exemplary embodiments without departing from the principles and spirit of the general inventive concept, the scope of which is defined in the appended claims and their equivalents.

What is claimed is:

1. An image sensing apparatus comprising:
a lens group which forms a concave focal surface;
an optical unit comprising:
  a curved top surface,
  a flat bottom surface, and
  a plurality of light guides, the curved top surface corresponding to the concave focal surface, the optical unit being disposed under the lens group so that the curved top surface coincides with the concave focal surface, and the plurality of light guides collecting light emitted from the lens group and guiding the light to the flat bottom surface; and
an image sensor disposed under the optical unit, wherein the plurality of light guides are a plurality of artificial ommatidia and the optical unit is an artificial ommatidia unit, wherein each of the plurality of light guides of the optical unit comprises:
 a micro lens disposed at the top surface of the optical unit, and
 a waveguide disposed under the micro lens, which transmits the light entering the micro lens, wherein each of the plurality of light guides is perpendicular to a respective tangent of the curved top surface where a top surface of the waveguide intersects the curved top surface, such that a first light guide, of the plurality of light guides, is perpendicular to a first tangent where a top surface of a waveguide of the first light guide intersects the curved top surface, and a second light guide, of the plurality of light guides, is perpendicular to a second tangent where a top surface of a waveguide of the second light guide intersects the curved top surface, and wherein the first tangent is different from the second tangent.

2. The image sensing apparatus of claim 1, wherein one of the plurality of light guides of the optical unit corresponds to at least one pixel among a plurality of pixels of the image sensor.

3. The image sensing apparatus of claim 1, wherein the optical unit is formed of a photosensitive polymer resin.

4. The image sensing apparatus of claim 1, wherein a light transmission length of one of the plurality of light guides, is directly proportional to a distance of the one of the plurality of light guides from an optical axis of the lens group.

5. The image sensing apparatus of claim 3, wherein the photosensitive polymer resin comprises an SU-8 resin.

6. The image sensing apparatus of claim 3, wherein the waveguide comprises a self-written waveguide formed by ultraviolet rays.

7. The image sensing apparatus of claim 4, wherein the plurality of light guides comprises a first light guide and a second light guide, the first light guide is closer to the optical axis than the second light guide, and
 a light transmission length of the first light guide is shorter than a light transmission length of the second light guide.

8. An image sensing apparatus comprising:
 a lens forming a concave focal surface;
 an optical waveguide unit comprising:
  a receiving face substantially aligned with and disposed at the concave focal surface;
  a plurality of waveguides; and
  a flat output face; and
 an image sensor disposed under the optical waveguide unit,
 wherein the flat output face of the optical waveguide unit is substantially parallel to a planar surface of the image sensor,
 wherein the plurality of waveguides are a plurality of artificial ommatidia, and the optical waveguide unit is an artificial ommatidia unit,
 wherein each of the plurality of waveguides comprises:
  a micro lens disposed at the receiving face of the optical waveguide unit, and
  a waveguide disposed under the micro lens, which transmits the light entering the micro lens,
 wherein each of the plurality of waveguides is perpendicular to a respective tangent of the curved focal surface where a top surface of the waveguide intersects the curved focal surface, such that a first waveguide, of the plurality of waveguides, is perpendicular to a first tangent where a top surface of the first waveguide intersects the curved top surface, and a second waveguide, of the plurality of waveguides, is perpendicular to a second tangent where a top surface of the second waveguide intersects the curved top surface, and
 wherein the first tangent is different from the second tangent.

9. The image sensing apparatus of claim 8, wherein a light transmission length of one of the plurality of waveguides, is directly proportional to a distance of the one of the plurality of waveguides from an optical axis of the lens.

10. The image sensing apparatus of claim 9, wherein the plurality of waveguides comprises a first waveguide and a second waveguide,
 the first waveguide is closer to the optical axis than the second waveguide, and
 a light transmission length of the first waveguide is shorter than a light transmission length of the second waveguide.

11. An image sensing apparatus comprising:
 a lens forming a concave focal surface;
 a waveguide unit comprising:
  a receiving face; and
  a plurality of waveguides; and
 an image sensor disposed under the waveguide unit,
 wherein a light transmission length of one of the plurality of waveguides, is directly proportional to a distance of the one of the plurality of waveguides from an optical axis of the lens,
 wherein the plurality of waveguides are a plurality of artificial ommatidia and the waveguide unit is an artificial ommatidia unit,
 wherein each of the plurality of waveguides comprises:
  a micro lens disposed at the receiving face of the waveguide unit, and
  a waveguide disposed under the micro lens, which transmits the light entering the micro lens,
 wherein each of the plurality of waveguides is perpendicular to a respective tangent of the receiving face where a top surface of the waveguide intersects the receiving face, such that a first waveguide, of the plurality of waveguides, is perpendicular to a first tangent where a top surface of the first waveguide intersects the receiving face, and a second waveguide, of the plurality of waveguides, is perpendicular to a second tangent where a top surface of the second waveguide intersects the receiving face, and
 wherein the first tangent is different from the second tangent.

12. The image sensing apparatus of claim 11, wherein the plurality of waveguides comprises a first waveguide and a second waveguide,
 the first waveguide is closer to the optical axis than the second waveguide, and
 a light transmission length of the first waveguide is shorter than a light transmission length of the second waveguide.

* * * * *